(12) United States Patent
Varahram et al.

(10) Patent No.: US 11,139,781 B2
(45) Date of Patent: Oct. 5, 2021

(54) POWER AMPLIFIERS

(71) Applicant: National University of Ireland, Maynooth, Maynooth (IE)

(72) Inventors: Pooria Varahram, Maynooth (IE); John Dooley, Maynooth (IE); Keith Finnerty, Maynooth (IE); Ronan Farrell, Maynooth (IE)

(73) Assignee: National University of Ireland, Maynooth, Maynooth (IE)

( * ) Notice: Subject to any disclaimer, the term of this patent is extended or adjusted under 35 U.S.C. 154(b) by 593 days.

(21) Appl. No.: 16/074,246

(22) PCT Filed: Dec. 14, 2016

(86) PCT No.: PCT/EP2016/080898
§ 371 (c)(1),
(2) Date: Jul. 31, 2018

(87) PCT Pub. No.: WO2017/133816
PCT Pub. Date: Aug. 10, 2017

(65) Prior Publication Data
US 2021/0184630 A1      Jun. 17, 2021

(30) Foreign Application Priority Data
Feb. 1, 2016   (GB) ...................... 1601751

(51) Int. Cl.
*H04L 27/26* (2006.01)
*H03F 1/02* (2006.01)
*H03F 3/24* (2006.01)

(52) U.S. Cl.
CPC ........... *H03F 1/0205* (2013.01); *H03F 3/245* (2013.01); *H04L 27/2623* (2013.01)

(58) Field of Classification Search
CPC . H03F 1/00; H03F 1/02; H03F 1/0205; H03F 1/025; H03F 1/0266; H03F 3/24;
(Continued)

(56) References Cited

U.S. PATENT DOCUMENTS

2004/0090283 A1* 5/2004 Naito .................. H03G 11/008
                                                            333/17.2
2008/0200126 A1  8/2008  Okada et al.
(Continued)

FOREIGN PATENT DOCUMENTS

EP   1195892 A1   10/2002
GB   2477986 A    8/2011

OTHER PUBLICATIONS

PCT International Search Report and Written Opinion for International Application No. PCT/EP2016/080898, dated Mar. 24, 2017.
(Continued)

*Primary Examiner* — Siu M Lee
(74) *Attorney, Agent, or Firm* — Hoffman Warnick LLC (57) ABSTRACT

Disclosed is a method of reducing the Instantaneous to Average Power Ratio, IAR, of a transmitter system, comprising the steps of: receiving an input digital signal comprising a plurality of samples; extracting magnitude information for each of the plurality of samples; selecting a plurality of samples whose magnitude exceeds a predefined threshold; sorting, by magnitude, the selected plurality of samples; selecting from the sorted plurality of samples, only those samples having a spacing more than a first pre-defined spacing and filtering those samples, using an FIR filter; subtracting the output of the FIR filter from a delayed version of the input digital signal to produce an output signal.

7 Claims, 7 Drawing Sheets

(58) Field of Classification Search
CPC ............... H03F 3/245; H03F 2200/66; H03F 2201/3236; H04L 27/26; H04L 27/2601; H04L 27/2614; H04L 27/2623; H04L 27/2624

See application file for complete search history.

(56) References Cited

U.S. PATENT DOCUMENTS

| | | | |
|---|---|---|---|
| 2011/0227628 A1* | 9/2011 | Sato ..................... | H03F 3/245 327/361 |
| 2011/0228872 A1* | 9/2011 | Soler Garrido ..... | H04L 27/2623 375/295 |
| 2014/0044215 A1* | 2/2014 | Mundarath ......... | H04L 27/2624 375/297 |
| 2020/0204420 A1* | 6/2020 | Megretski ............. | H04B 1/12 |

OTHER PUBLICATIONS

Great Britain Search Report for Application No. GB1601751.9, dated Jul. 29, 2016.

* cited by examiner

POWER AMPLIFIERS

FIELD

The present invention relates to improvements in the performance and operation of power amplifiers, particularly those used in telecommunication apparatus, such as mobile telephones and other mobile or fixed devices.

BACKGROUND

A primary purpose of a telecommunication system is to transmit data or information from one point to another, or to put it another way, from a source to a destination. Typically, a communication system may be characterised by three parts: a transmitter; a channel; and a receiver.

The main components of a transmitter typically comprise a coding system, an interleaving system, a modulation system, a digital to analog converter (DAC), a mixer, a filter, a power amplifier (PA) and an antenna.

Due to an ever increasing number of subscribers wishing to make use of telecommunication systems and a similarly increasing demand for high data rate services in such wireless communication systems, power consumption of such mobile devices is increasing, often faster than improvements in battery technology, which can result in user dissatisfaction with battery life and consequent availability of the mobile devices.

As such, there is a desire to minimise power consumption in mobile devices and, since the power amplifier is one of the most power hungry components in mobile devices, the efficient use of power is of increasing importance in mobile devices.

Figure 1:
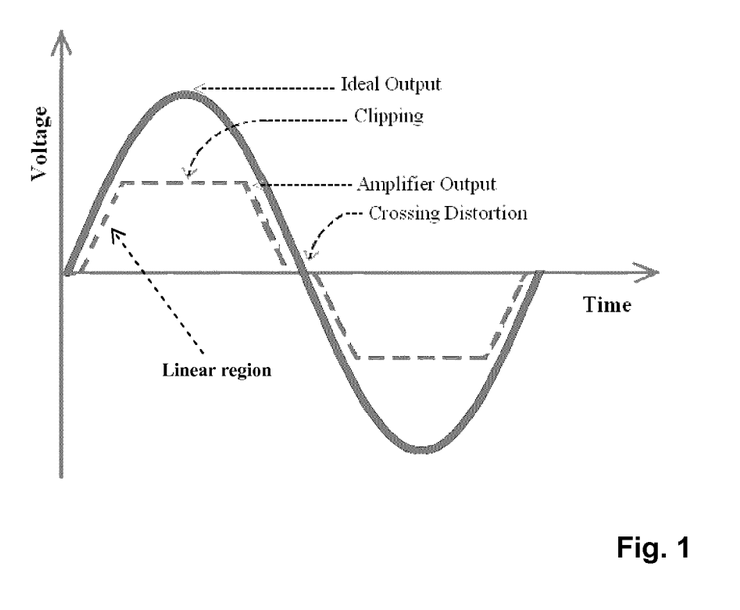
FIG. 1 shows an idealised power amplifier output and a more realistic, clipped, output, demonstrating the non-ideal performance of a typical PA.

A simplified demonstration of the basic performance of a power amplifier is shown in FIG. 1. The sinusoid shown by the solid line represents the ideal output of a power amplifier fed with a sinusoidal input. The dashed line represents an actual output and it demonstrates several of the issues associated with power amplifiers.

A PA will not typically amplify very low signal levels and this results in a cut-off region where the PA output is zero for small input signals. This is known as the cut off region and can result in crossing distortion as shown in FIG. 1.

The amplifier will amplify in a broadly linear fashion as shown in FIG. 1, for a range of input signals. In this range, the amplifier output will be a linear multiple of the input amplitude. The linear region extends until the PA output is clipped, which corresponds to the point at which an increase in input signal amplitude no longer results in an increase in PA output amplitude.

These practical issues manifest themselves in various ways in real-life scenarios and can adversely affect system operation.

There are many different approaches taken to the problem of power amplifier optimisation. Many of these are well-known in the prior art and include approaches such as clipping, filtering, noise shaping, peak cancellation and peak windowing. It is beyond the scope of the present application to explore these in great detail, beyond noting that there are both problems and advantages associated with each prior art technique.

However, such techniques can be broadly classified into two distinct categories: distortion-based and distortion-less. In the first category, some distortion will be created that violates the spectral emission mask (SEM). Techniques such as clipping fall into this category. If the main aim in the design of a system is to achieve maximum efficiency, then some distortion may be tolerated.

The second category includes techniques that do not introduce any distortion, and are sometimes called scrambling techniques. For this category, known techniques such as Peak to Average Power Ratio (PAPR) or Crest Factor Reduction (CFR) can be used to measure the performance.

High data rate signals have a fluctuated envelope which crests at some time instances. These crests in a data stream pass through the power amplifier which can create spectral leakage and adjacent channel interference (ACI) that violates the spectrum emission mask (SEM), which defines acceptable performance parameters for a particular communication standard.

To address this problem, it is possible to "back off" the power amplifier, reducing the crests. This causes a degradation in power efficiency, which may result, for example, in poor coverage in cellular system, call drops, low quality of service or other undesirable effects. Hence it is an aim of embodiments of the present invention to reduce the instantaneous to average power ratio (IAR) of a signal.

The net effect of these and other non-ideal properties result in problems with practical PA performance and embodiments of the present invention aim to address these problems and others, not set out herein explicitly.

SUMMARY

According to a first aspect of the present invention, there is provided a method of reducing the Instantaneous to Average Power Ratio, IAR, of a transmitter system, comprising the steps of:

receiving an input digital signal comprising a plurality of samples; extracting magnitude information for each of the plurality of samples; selecting a plurality of samples whose magnitude exceeds a predefined threshold; sorting, by magnitude, the selected plurality of samples; selecting from the sorted plurality of samples, only those samples having a spacing more than a first predefined spacing and filtering those samples, using an FIR filter;

subtracting the output of the FIR filter from a delayed version of the input digital signal to produce an output signal.

In an embodiment of the invention, the output of the FIR filter is scaled before the step of subtracting, wherein the scaling factor is determined for a particular communication standard or particular hardware setup, which may be fixed or varied dynamically.

In an embodiment of the invention, the first predefined spacing is determined by: obtaining the coefficients of the FIR filter; determining the position and of a centre tap of the FIR filter; normalising the filter with respect to a maximum of its absolute value; and determining a position of a first sample from the centre tap having a magnitude lower than a predefined fraction of a magnitude of the sample at the centre tap, and setting the first predefined spacing to be equal to the number of samples between the centre tap and the first sample so determined.

In an embodiment of the invention, there is a further step of determining a second predefined spacing by obtaining the coefficients of the FIR filter; determining the position and of a centre tap of the FIR filter; normalising the filter with respect to a maximum of its absolute value; determining a location of a second highest peak in an impulse response of the FIR filter; determining a position of a first sample from the second highest peak having a magnitude lower than a predefined fraction of a magnitude of the sample at the centre tap, and setting the second predefined spacing to be equal to the number of samples between the centre tap and the first sample from the second highest peak, so determined; and: selecting and filtering, using the FIR filter, from the sorted plurality of samples, those selected samples having a separation more than the first predefined spacing or the second predefined spacing.

According to a further aspect of the invention, there is provided an apparatus arranged to perform the method according to the first aspect.

BRIEF DESCRIPTION OF DRAWINGS

For a better understanding of the invention, and to show how embodiments of the same may be carried into effect, reference will now be made, by way of example, to the accompanying diagrammatic drawings in which.

DESCRIPTION OF EMBODIMENTS

In order to properly understand embodiments of the present invention, a brief discussion of certain prior art techniques follows.

A simple prior art method of reducing IAR involves simply clipping any signal peaks above a predefined threshold. However, the immediate effect of this is to the generation of out-of-band distortion and a high Error Vector Magnitude (EVM). This very simple method is not practically feasible.

It may be made more useful if the sharp cut-offs introduced by the clipping are filtered. This reduces the distortion somewhat, but it is generally still at a level which is not practically useful.

A prior art technique known as noise-shaping can be used, which offers an improved performance over the simple clipping and filtering approach referred to previously. The methodology of noise shaping is to first clip the signal peaks and then subtract the delayed signal from the clipped signal to create the clipping noise. The result is passed through a noise shaping filter to confine the spectrum and suppress the distortion. Finally the delayed signal is subtracted from the filtered clipped signal.

A practical problem with noise shaping techniques is that they often require several stages and parallel banks of filters, resulting in a highly complex system. In the context of this application complexity refers to the number of complex multipliers required to implement the technique. Such complex multipliers are major parts of the real-estate of the chipset and consume a relatively large amount of power and, so, it is generally desirable to minimise complexity.

In a further prior art technique, known as peak cancellation, individual peaks in a signal are selected and reduced in scale before the signal is reassembled. This has certain advantages over noise shaping, but typically requires several stages in order to meet the specified standards, which has the effect of then increasing the complexity.

Figure 2:
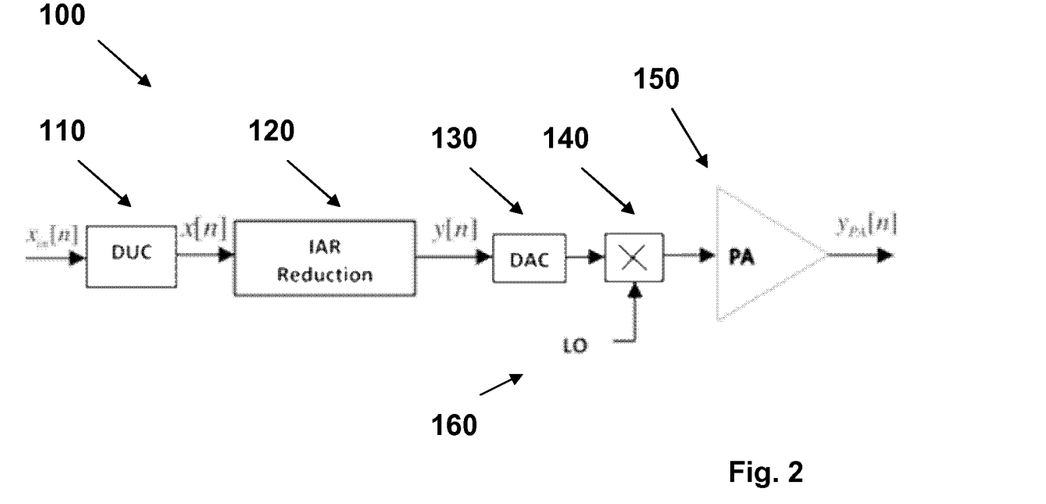
FIG. 2 shows a transmitter configuration according to an embodiment of the present invention.

FIG. 2 shows a transmitter 100 according to an embodiment of the present invention. The transmitter 100 comprises a Digital Up Converter (DUC) 110, which operates in a known way. The output of the DUC 110 supplies a signal x[n] to an IAR Reduction unit 120 according to an embodiment of the present invention. The IAR reduction unit 120 operates to reduce the IAR of its input signal to address the problems which have been set out previously. A detailed description of the IAR reduction unit 120 will follow.

The output of the IAR reduction unit 120, y[n], is fed to a Digital to Analog Converter (DAC) 130 which operates in a known way to convert its digital input signal to an analog signal, suitable for transmission.

The output of the DAC 130 is applied to a mixer 140, where it is mixed with a carrier signal supplied from Local Oscillator (LO) 160 and the resultant signal passed to the power amplifier (PA) 150. The output from the PA is $y_{PA}[n]$.

Figure 3A:
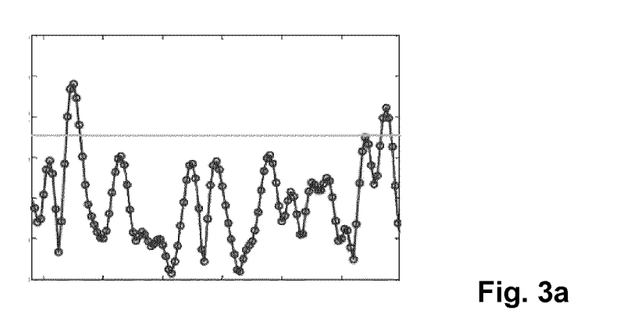
FIGS. 3a and 3b illustrate input and output signals, respectively, of an IAR reduction unit according to an embodiment of the present invention.
Figure 3B:
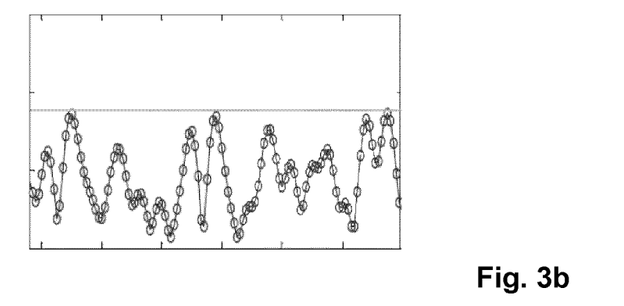

FIGS. 3a and 3b show representations of waveforms at two important points in the transmission chain. FIG. 3a represents x[n], the input to the IAR reduction unit 120, and FIG. 3b represents y[n], the output from the IAR reduction unit 120.

In FIG. 3a, there is shown a number of samples, representing the signal from the DUC 110. Also shown is a horizontal line which represents a threshold, whereby signals lying above the threshold lead to poor IAR performance and can introduce problems with the PA performance, as described previously.

FIG. 3b shows the result of processing the signal of FIG. 3a by the IAR reduction unit 120. Here, it can be seen that all the sample points now lie at or below the threshold, meaning that the PA is able to perform to the required standard, as the signal which is it supplied with has been modified to reduce the IAR.

Figure 4:
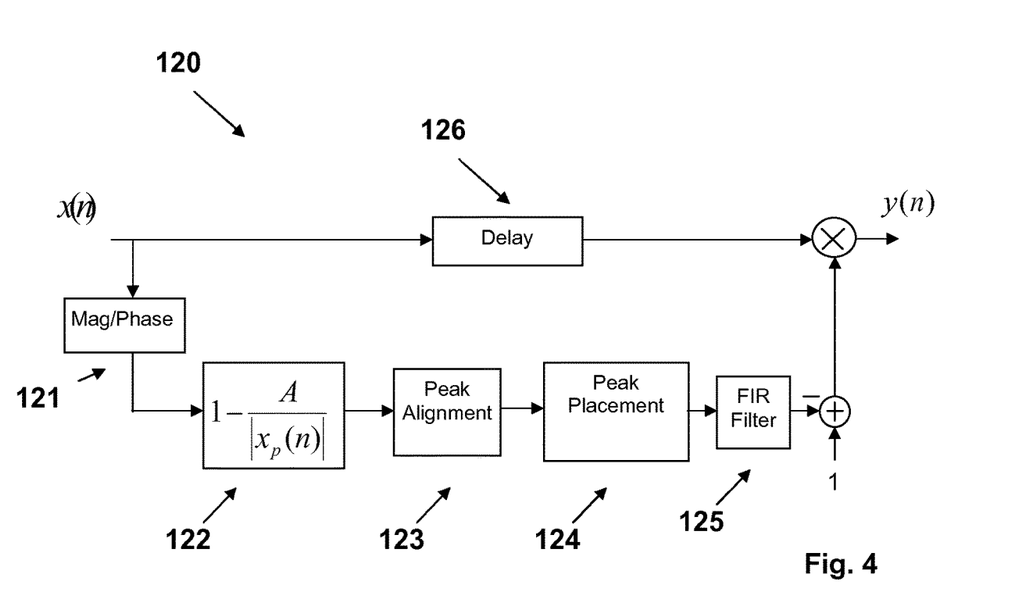
FIG. 4 shows a detailed schematic of elements forming an IAR reduction unit according to an embodiment of the present invention.

FIG. 4 shows a schematic of the functional elements included in the IAR reduction unit 120.

The input x[n] is passed down two distinct branches. In the first, it is delayed by delay block 126 and in the second branch, it is processed to perform optimum peak placement as will be described. The delay required depends on the group delay of FIR filter 125, peak placement function 124 and the number of stages required, which will be explained later.

In the second branch, the signal is processed to extract magnitude information which is used as the basis for the subsequent processing The scaling signal is created by dividing the predefined threshold to the magnitude of the peaks minus 1. The remaining signals that are less than threshold value become zero in the peak scaling block 122. The value of the threshold depends on several factors in terms of performance and complexity. However the value has to comply with the various requirements of the wireless communication standard with which the embodiment of the invention is going to be deployed.

Mathematically the peak scaling can be expressed by, $$\text{Peak Scaling} = \begin{cases} 0 & \text{if } |x(n)| \leq A \\ 1 - \frac{A}{|x(n)|} & \text{if } |x(n)| > A \end{cases}$$

Where x(n) is the input signal and A is the predefined threshold value.

In other words, the magnitude signal leaving block 121 passes through the peak scaling block 122, where any peaks which lie below the threshold A are discarded and only peaks which lie above the threshold A are allowed to pass to the peak alignment block 123.

In blocks 123 and 124, the peaks which are allowed to pass are aligned and placed before being filtered by FIR filter 125. The processes involved here are described in more detail in conjunction with FIG. 5, which portrays a further embodiment of the invention.

Figure 5:
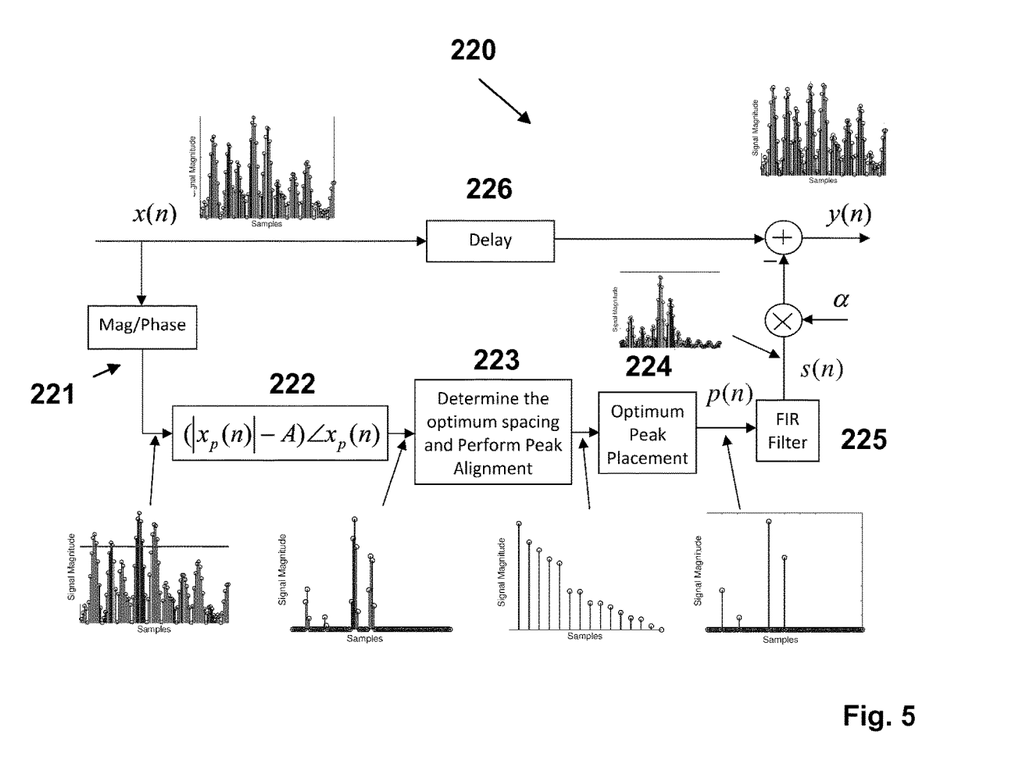
FIG. 5 shows a detailed schematic of elements forming an IAR reduction unit according to another embodiment of the present invention, together with illustrative signal waveforms.

In order to deal with the phase of the input x(n) signal, which is often ignored in prior art solutions, the embodiment of FIG. 5 accommodates the phase of the signal, which leads to an improved performance. FIG. 5, also includes illustrative signal waveforms at various points in the system, to assist in the understanding of the system.

As with the embodiment of FIG. 4, there are two branches. In the first branch, the input signal x(n) is delayed in block 226. The second branch differs from the second branch of FIG. 4 in that phase information is considered as well. Block 221 extracts magnitude and phase information, both of which are processed in the following blocks to yield an improved performance compared to considering magnitude alone.

First the input signal can be separated into the peak vector and non-peak vector as follows;

$$x(n) = |x_P(n)| \angle x_P(n) + |x_{NP}(n)| \angle x_{NP}(n)$$

where $x_P(n)$ and $x_{NP}(n)$ are the peak and non-peak samples of the input signal.

The desired output signal y(n) can be written as:

$$y(n) = A \angle x_P(n) + |x_{NP}(n)| \angle x_{NP}(n)$$

where A is the predefined threshold, which can be selected based on the specific requirements of a particular communication standard or the operation of the system hardware. The threshold A is shown as the horizontal line on the waveform of the signal leaving block 221.

It may be necessary to determine this empirically from case to case, but once determined, it can be set and fixed for a particular configuration. Alternatively, A may be varied dynamically, to adapt for changes in the communication standard or system hardware.

The signal leaving peak scaling block 222 can be seen to comprise only those samples which exceed the threshold shown in the preceding waveform.

The signal next passes to the peak spacing and alignment block 223. This acts to sort the input samples into descending magnitude order, spaced apart by a determined spacing, The means by which this determined spacing is derived, will be described later.

Following this block, the sorted and spaced samples pass to the optimum peak placement block 224, which acts to only pass peaks which have spacing more than a predetermined value through to the FIR filter 225.

The signal leaving the optimum peak placement block 224 p(n) may be written as:

$$p(n) = x(n) - d(n) = |x_P(n)| \angle x_P(n) + |x_{NP}(n)| \angle x_{NP}(n) - A \angle x_P(n) + |x_{NP}(n)| \angle x_{NP}(n) = |x_P(n)| \angle x_P(n) - A \angle x_P(n) = (|x_P(n)| - A) \angle x_P(n)$$

Hence the peak scaling is derived as follows:

$$p(n) = \begin{cases} 0 & \text{if } |x(n)| \leq A \\ (|x(n)| - A) \angle x(n) & \text{if } |x(n)| > A \end{cases}$$

Any samples with spacings lower than the predetermined value are discarded. The peaks which are selected to pass are then re-positioned into their original locations as shown in the waveform entering FIR filter 225.

The signal leaving the FIR filter 225 may be represented as:

$$y(n) = x(n-d) - \alpha \sum_{p=1}^{P} [(|x_p(n)| - A_{th}) \cdot \delta(n-p) e^{i\theta_p}] * w(n)$$

where the second part is the convolution of the cancellation pulse with the coefficients (impulse response) of the FIR filter denoted w(n), and d is the delay which theoretically equals the group delay of the FIR filter i.e. length of the filter over 2.

The parameter α is a scaling factor which may be obtained from the formula below:

$$\alpha = \frac{\max(|s(n)|)}{\max(|p(n)|)}$$

where p(n) and s(n) are the input and output signals, respectively, of the FIR filter. Here the value of α is given as constant. However the value may updated for each iteration or at some other interval, as required.

It should be noted that α only impacts on the peaks of a signal and if its value is less than one, EVM is higher but a lower IAR value can be achieved. If it is slightly greater than one, EVM improves but IAR degrades. In embodiments of this invention the value of α is constant and equals 1.05. In other embodiments, a different value may be chosen as needed. This may be set empirically and fixed for a particular system or standard, as required.

It is important to realise that peak regrowth is created from contiguous peaks. This is due to the fact that the input signal of the IAR reduction unit 120 is an up-sampled signal and hence the contiguous peaks can exceed the threshold at the same time. Peak regrowth causes spectral leakage or out of band radiation and EVM deterioration.

Returning to FIG. 5, it is necessary to understand the peak spacing and alignment block 223. The flow chart of FIG. 6 details the steps involved in this process. The first step 301 is to obtain the FIR filter impulse response. This can be done by recalling the coefficients stored in the system memory. For each telecommunication standard, the corresponding filter can be designed offline and its coefficients are saved in system memory. The impulse response of the filter can be shown by h[n], where h[n] is equal to the coefficients value. The length of the FIR filter denotes N and it must be odd. It should be noted that the FIR filter for a multicarrier signal not centred around 0 Hz is complex and for a single carrier signal, it is real.

Figure 6:
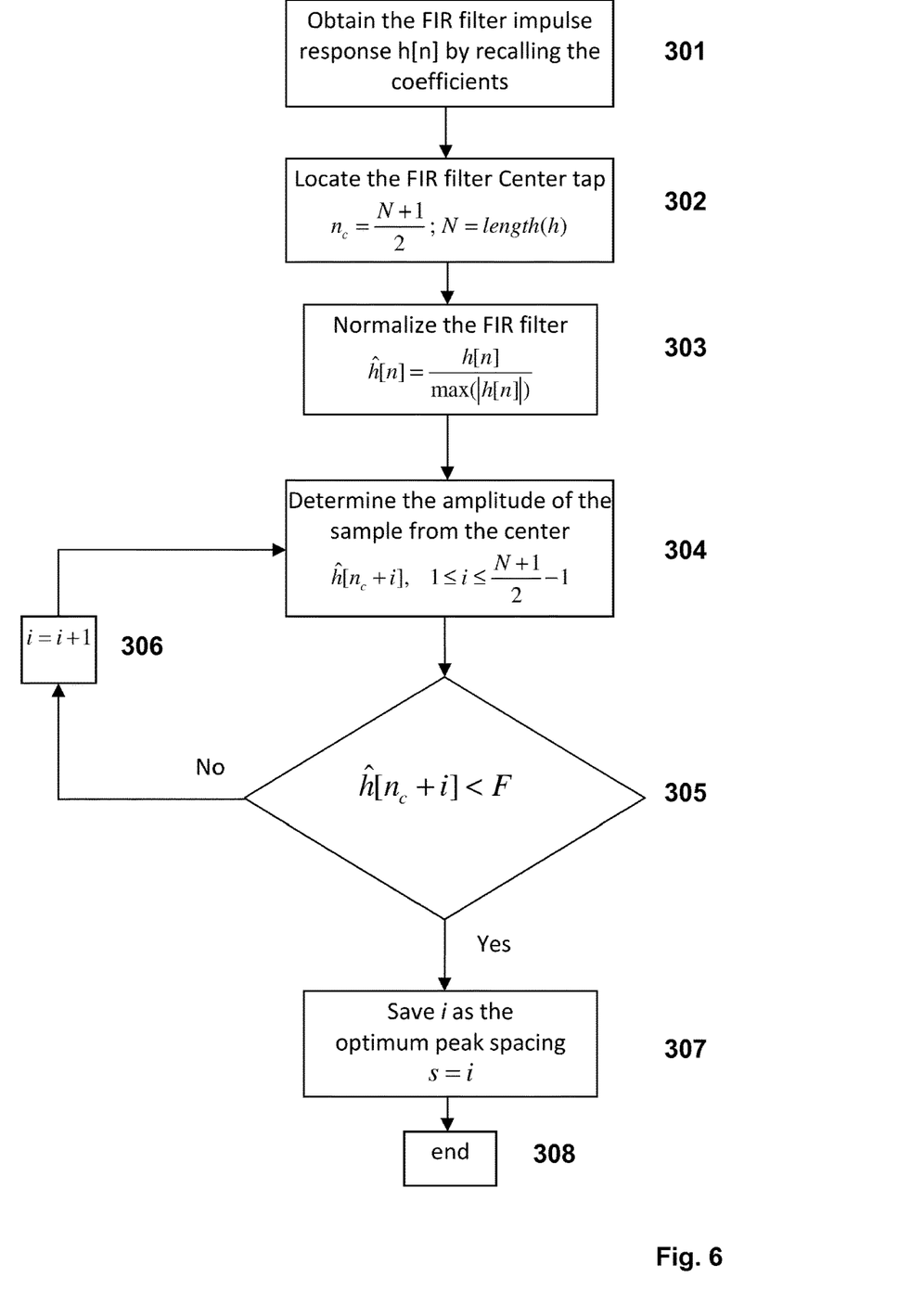
FIG. 6 shows a flowchart for use in determining optimum peak spacing for an embodiment using one stage.

The next step 302 is to locate the centre tap, $n_c$, where $$n_c = \frac{N+1}{2}$$

which has the maximum amplitude. After this, at step 303, the filter is normalized by dividing h[n] by the maximum of its absolute value, giving $$\hat{h}[n] = \frac{h[n]}{\max(|h[n]|)}.$$

Hence, the normalised centre tap amplitude is equal to one $\hat{h}[n_c]=1$. This allows the optimum peak spacing to be derived. It should be noted that due to the symmetry of the FIR filter only one side of the filter needs to be selected to search for the optimum spacing value. The sample sequence of FIR filter impulse response can be given by $$\text{sample}(n) = \left\{1, 2, \ldots, \frac{N+1}{2}, \frac{N+1}{2}+1, \ldots, N\right\}$$

And due to the symmetry of the FIR filter, $$h[n] = h[N-n+1], 1 \leq n \leq \frac{N+1}{2} - 1$$

where N is the FIR filter length and n is the sample number.

The next steps 304, 305 and 306 count from the centre to find the first sample from the centre which has an amplitude less than a specified fraction "F" of the centre tap amplitude. Because the impulse response is normalized, then the amplitude of the centre tap equals one. The fraction "F" is dependent on certain factors such as sampling rate and number of carriers. For the example that used herein, F is 10%. This value is chosen since those samples with an amplitude less than 10% of the amplitude of the centre tap do not have any significant impact on peak regrowth and/or IAR reduction performance. Therefore, small peaks can be allowed due to the fact that in IAR reduction, some distortion (e.g. below the spectral emission mask) can be tolerated. Hence such low amplitudes are trivial.

By finding the location of the first sample satisfying the condition in step 305, the spacing between the centre tap and that location is the optimum spacing that is required to avoid peak regrowth and achieve optimum IAR reduction performance. It should be noted that there is a compromise involved in setting the value of spacing in which the lower the spacing value the higher the probability of peak regrowth and the higher the spacing the higher the probability of losing some peaks. In both cases the result is the performance degradation. Hence the optimum spacing value achieves the best performance in terms of IAR reduction and EVM performance.

Figure 7:
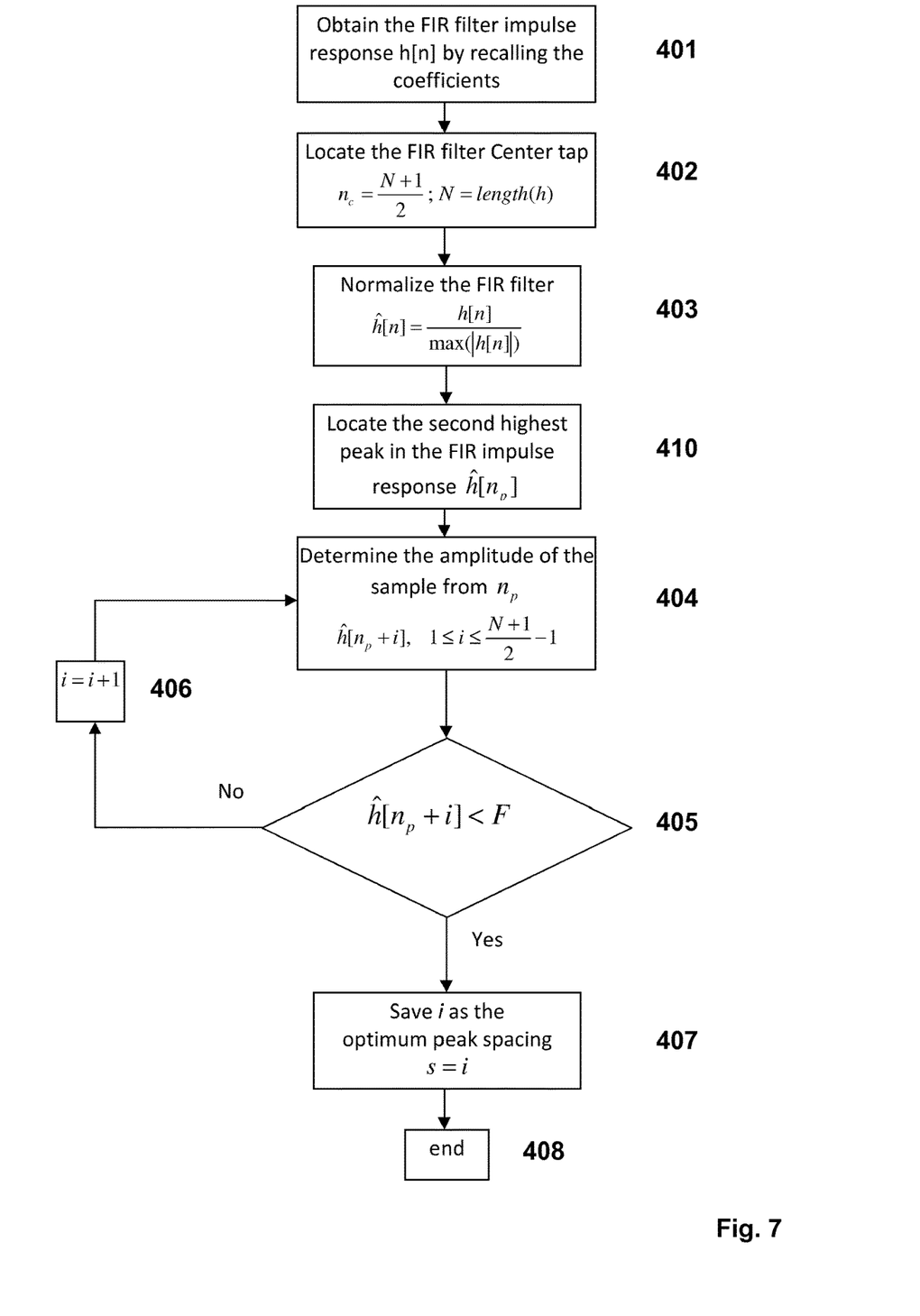
FIG. 7 shows a flowchart for use in determining optimum peak spacing for another embodiment using two stages.

In most practical cases, more than one stage of the process shown in FIG. 6 is required. Therefore, two values for spacing usually have to be applied in each stage. To reduce the complexity and hardware resource, the optimum spacing value is different for each stage. By observing the FIR filter impulse response, the other spacing value can be obtained. The same basic procedure illustrated in FIG. 6 can be performed to obtain the optimum peak spacing. This is shown in FIG. 7. Like numbered steps in FIG. 6 and FIG. 7 are functionally identical and so are not described again in detail. The key difference is step 410 whereby instead of seeking the highest peak in the FIR impulse response, the second highest peak is located. The location of the next peak, working from the centre, which is less than F is then determined, and the second spacing is set to the number of samples of that peak from the centre tap.

Figure 8:
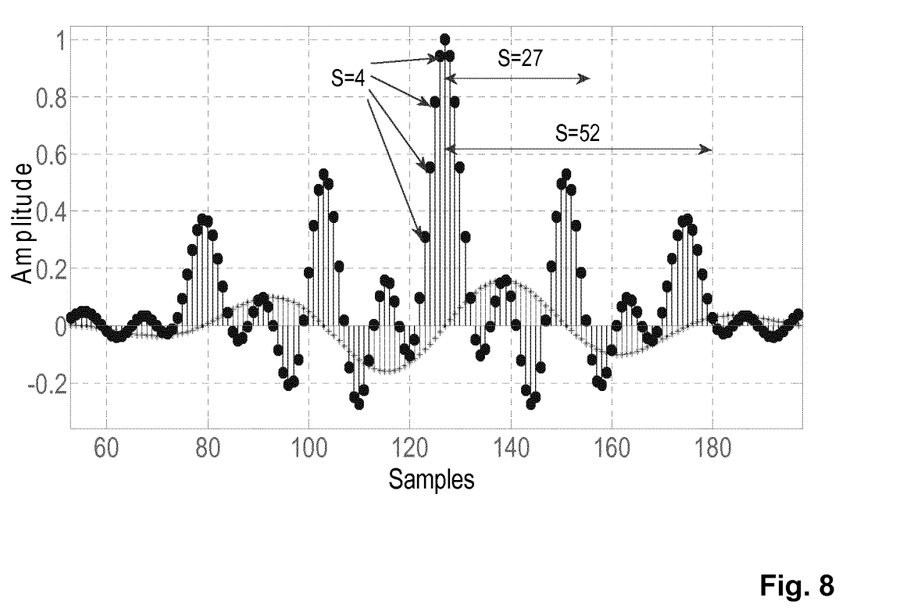
FIG. 8 shows a sample impulse response for a typical signal type.

FIG. 8 shows the other spacing that is needed for the case of 2 stages. The second spacing shall be determined from the location of the second highest amplitude or the first side lobe in the filter impulse response—step 410.

This value is intuitively higher than the one derived by the method of FIG. 6 because it is further from the centre tap. To achieve the lowest EVM, the higher spacing value obtained from FIG. 7 should be applied for the first stage and the lower spacing value obtained from FIG. 6 for the second stage.

Examples of this two stage approach are shown in FIG. 8, the impulse response of the FIR filter for a 6 carrier TD-SCDMA signal. This shows the two values of spacing, where S=4 in one stage and S=27 in the other. If a single stage is used, then the single value of spacing required is S=4.

It can be seen that the impulse response has the highest amplitude taps from samples 122 to 132 with the maximum located at 127. The spacing between this centre tap, which has been normalised to give an amplitude of 1, and the closest amplitude level less than F is 4 samples away, making S=4. This is the optimum value of the peak placement to avoid peak regrowth when only one stage is applied.

It should be noted that with only one stage the performance may not be satisfactory and hence a second stage may be needed, depending on system performance requirements.

It can be observed that there are two other values for S indicated (S=27 or S=52) in FIG. 8. These are the possible spacings to be chosen for one of the stages, in the case of two stages being required.

Hence for a single stage, the spacing is set S=4. For the case requiring two stages, then the first stage uses S=27 and S=4 for the second stage. The value of S=27 is selected since it represents the second highest peak in the impulse response, as set out in FIG. 7. Following the peak placement, the cancellation pulse will go through the filter and multiply with a scaling factor parameter α as discussed previously.

Returning to FIG. 5, once the optimum peak spacing has been determined in block 223, as set out above, the optimum peak placement is performed. This is carried out according to the method shown in FIG. 9.

Figure 9:
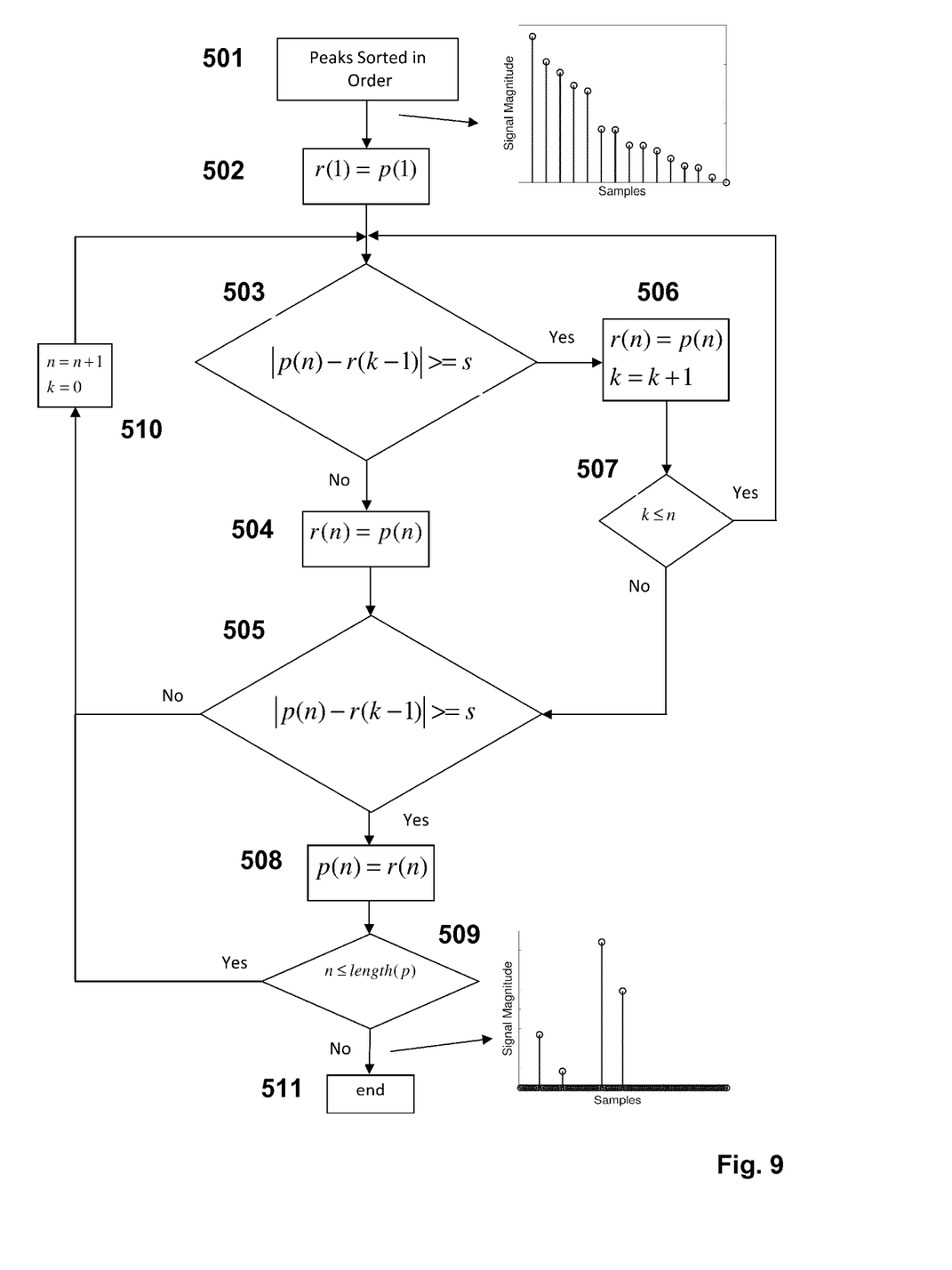
FIG. 9 shows a flowchart for performing optimum peak placement according to an embodiment of the present invention.

At step 501, the peaks are sorted into descending order of magnitude. This simplifies the optimum spacing allocation.

At step 502, the location of the first peak is stored in a register.

At step 503, starting from the second peak, the condition shown is checked, where s is the spacing value, defined previously and described in FIGS. 6 and 7. If the condition at step 503 is not met, then the last value of the peak is saved to the corresponding register, and then at step 505, the condition of step 503 is checked again for the other values of the peaks.

If the condition of step 503 is met, then at step 506, the value of the peak is saved in the corresponding register and the value of k is incremented.

At step 507, if the value of k is less than the corresponding number of peaks, denoted by n, then flow returns to step 503. Otherwise, it continues to step 505.

If the condition at step 505 is satisfied, then this means that the peak in question is in the optimum position and can be saved in the register at step 508.

At step 509, if the condition shown is not met, then the process ends at step 511. Otherwise, flow continues to step 510, where k is reset and n is incremented.

When the process ends at step 511, all the peaks which do not satisfy the conidition of step 503 are discarded and the remaining one which do satisfy the condition are passed.

FIG. 9 shows an example of the sorted peaks in size order, leaving step 501. Also shown are the peaks which are output after the method of FIG. 9 has run. This shows the peaks that have passed and are then positioned in their original positions i.e. before they were sorted. These peaks are then passed to the FIR filter 225.

The input to the optimum peak placement block 224 is an ordered set of peaks, whereby the order is set in terms of magnitude. Only peaks with a spacing less than the predetermined value are discarded and only peaks with spacing higher than the predetermined value will be selected to pass through the FIR filter. This process avoids the problem of peak regrowth. To eliminate the remaining peaks, this process is repeated by use of the second stage, as set out above.

The output of the FIR filter 225, after the scaling factor $\alpha$ is applied is subtracted from the delayed version of the input signal x(n) which emerges from delay block 226 to give the output signal y(n) which is applied to the PA 150. The signal y(n) is an IAR reduced version of the input signal which benefits from improved performance in terms of spectral emissions and EVM, as set out above.

The IAR technique complexity can be measured by a metric known as computational complexity reduction ratio (CCRR) as defined below:

$$CCRR = \left(1 - \frac{\text{Complexity of this invention}}{\text{Complexity of conventionl clipping}}\right) \times 100$$

The complexity here means the number of multiplications. Here the CCRR for a 6 carrier TD-SCDMA signal with 15 MHz bandwidth, filter length of 255, sampling frequency of 76.8 Msps, chip rate of 1.28 Mcps, number of samples is 51840 for one time slot and the value of $\alpha=1.05$ can be calculated as follows:

Complexity of conventional clipping and filtering for one iteration=No. of complex multipliers≈NL=51840*255=13,219,200, where N is the length of input signal and L is the filter length.

If all the peaks above the threshold are considered, hence this number for two stages can be calculated as C=(920+23)*255=240,465

For certain other prior art solutions, typical values range between 90,780 and 124,185. The complexity of embodiments of the present invention is 73,185, which represents a significant improvement over all the known prior art solutions.

In terms of the hardware implementation of embodiments of this invention, this can be achieved by means of known programmable logic devices, programmed using known techniques. The skilled person is aware of many different platforms which may be used.

Embodiments of the present invention offer the following advantages over prior art attempts to address this and similar problems:

improved EVM and IAR performance and lower computational complexity compared to prior art solutions;

The computational complexity is reduced due to fewer multiplications. By applying optimum peak placement in first and second stages, fewer peaks will be allocated which reduces the number of multiplications and hence the complexity;

greater flexibility to deal with multi-carrier signals in order to reduce IAR while keeping EVM low. The flexibility provided in embodiments of this invention can optimize the system performance around required Quality of Service (QoS) and EVM. This is in contrast with the prior art, which tend force a consistent and limited EVM regardless of the QoS or EVM required. This flexibility provides the option to optimize EVM based on the traffic in the channel and the requirement of QoS without spectral regrowth. Hence, embodiments of this invention can be applied in wideband applications, such as 5G; and there is no feedback path required to obviate the peak regrowth problem. This significantly reduces the computational complexity.

Attention is directed to all papers and documents which are filed concurrently with or previous to this specification in connection with this application and which are open to public inspection with this specification, and the contents of all such papers and documents are incorporated herein by reference.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment(s). The invention extends to any novel one, or any novel combination, of the features disclosed in this specification (including any accompanying claims, abstract and drawings), or to any novel one, or any novel combination, of the steps of any method or process so disclosed.

The invention claimed is:

1. A method of reducing the Instantaneous to Average Power Ratio, IAR, of a transmitter system, comprising the steps of:
   receiving an input digital signal comprising a plurality of samples;
   extracting magnitude information for each of the plurality of samples;
   selecting a plurality of samples whose magnitude exceeds a predefined threshold;
   sorting, by magnitude, the selected plurality of samples;
   selecting from the sorted plurality of samples, only those samples having a spacing more than a first predefined spacing and filtering those samples, using an FIR filter; and
   subtracting an output of the FIR filter from a delayed version of the input digital signal to produce an output signal, wherein the output of the FIR filter is scaled before the step of subtracting, and wherein a scaling factor is determined for a particular communication standard or particular hardware setup, the scaling factor being fixed or varied dynamically.

2. The method of claim 1 wherein the first predefined spacing is determined by:
- obtaining coefficients of the FIR filter;
- determining a position and of a centre tap of the FIR filter;
- normalising the FIR filter with respect to a maximum of its absolute value; and
- determining a position of a first sample from the centre tap having a magnitude lower than a predefined fraction of a magnitude of the sample at the centre tap, and setting the first predefined spacing to be equal to the number of samples between the centre tap and the first sample so determined.

3. The method of claim 2, further comprising:
- determining a second predefined spacing by:
  - obtaining the coefficients of the FIR filter;
  - determining the position and of a centre tap of the FIR filter;
  - normalising the FIR filter with respect to a maximum of its absolute value;
  - determining a location of a second highest peak in an impulse response of the FIR filter;
  - determining a position of a first sample from the second highest peak having a magnitude lower than a predefined fraction of a magnitude of the sample at the centre tap, and setting the second predefined spacing to be equal to the number of samples between the centre tap and the first sample from the second highest peak, so determined; and:
- selecting and filtering, using the FIR filter, from the sorted plurality of samples, those selected samples having a separation more than the first predefined spacing or the second predefined spacing.

4. Apparatus arranged to perform the method according to claim 1.

5. A transmitter, comprising:
- a digital up converter (DUC);
- an Instantaneous to Average Power Ratio (IAR) reduction unit that receives an input digital signal from the DUC; and
- a digital to analog (DAC) that receives an output from the IAR reduction unit and outputs an analog signal suitable for transmission;
- wherein the IAR reduction unit is configured to reduce the IAR according to a process that includes:
  - receiving the input digital signal comprising a plurality of samples;
  - extracting magnitude information for each of the plurality of samples;
  - selecting a plurality of samples whose magnitude exceeds a predefined threshold;
  - sorting, by magnitude, the selected plurality of samples;
  - selecting from the sorted plurality of samples, only those samples having a spacing more than a first predefined spacing and filtering those samples, using an FIR filter; and
  - subtracting an output of the FIR filter from a delayed version of the input digital signal to produce an output signal, wherein the output of the FIR filter is scaled before the subtracting, and wherein a scaling factor is determined for a particular communication standard or particular hardware setup, the scaling factor being fixed or varied dynamically.

6. The transmitter of claim 5 wherein the first predefined spacing is determined by:
- obtaining coefficients of the FIR filter;
- determining a position and of a centre tap of the FIR filter;
- normalising the FIR filter with respect to a maximum of its absolute value; and
- determining a position of a first sample from the centre tap having a magnitude lower than a predefined fraction of a magnitude of the sample at the centre tap, and setting the first predefined spacing to be equal to the number of samples between the centre tap and the first sample so determined.

7. The transmitter of claim 5, further comprising:
- determining a second predefined spacing by:
  - obtaining coefficients of the FIR filter;
  - obtaining a position and of a center tap of the FIR filter;
  - normalising the FIR filter with respect to a maximum of its absolute value;
  - determining a location of a second highest peak in an impulse response of the FIR filter;
  - determining a position of a first sample from the second highest peak having a magnitude lower than a predefined fraction of a magnitude of the sample at the centre tap, and setting the second predefined spacing to be equal to the number of samples between the centre tap and the first sample from the second highest peak, so determined; and
- selecting and filtering, using the FIR filter, from the sorted plurality of samples, those selected samples having a separation more than the first predefined spacing or the second predefined spacing.

* * * * *